(12) United States Patent
Tabatowski-Bush

(10) Patent No.: US 9,529,049 B2
(45) Date of Patent: Dec. 27, 2016

(54) METHOD AND SYSTEM FOR CALIBRATING CURRENT SENSOR OF ELECTRIC VEHICLE BATTERY ELECTRONICS

(71) Applicant: Ford Global Technologies, LLC, Dearborn, MI (US)

(72) Inventor: Benjamin A. Tabatowski-Bush, South Lyon, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 470 days.

(21) Appl. No.: 14/100,739

(22) Filed: Dec. 9, 2013

(65) Prior Publication Data

US 2015/0160298 A1 Jun. 11, 2015

(51) Int. Cl.
| | | |
|---|---|---|
| *G01N 27/416* | (2006.01) | |
| *G01R 31/36* | (2006.01) | |
| *G01R 27/26* | (2006.01) | |
| *G01R 33/07* | (2006.01) | |
| *G01R 35/00* | (2006.01) | |
| *G01R 15/18* | (2006.01) | |
| *G01R 15/20* | (2006.01) | |

(52) U.S. Cl.
CPC .......... *G01R 31/361* (2013.01); *G01R 15/183* (2013.01); *G01R 15/202* (2013.01); *G01R 27/2611* (2013.01); *G01R 33/07* (2013.01); *G01R 33/072* (2013.01); *G01R 35/005* (2013.01); *G01R 31/3606* (2013.01)

(58) Field of Classification Search
CPC . G01R 15/183; G01R 15/202; G01R 27/2611; G01R 31/3606; G01R 31/361; G01R 33/07; G01R 33/072; G01R 35/005

USPC ......................................................... 324/426
See application file for complete search history.

(56) References Cited

U.S. PATENT DOCUMENTS

| | | | | |
|---|---|---|---|---|
| 5,677,604 | A * | 10/1997 | Masaki | B60L 11/1803 318/139 |
| 6,310,481 | B2 | 10/2001 | Bertness | |
| 6,411,078 | B1 * | 6/2002 | Nakagawa | G01R 15/20 324/117 H |
| 6,734,660 | B1 * | 5/2004 | Berkcan | G01R 15/205 324/117 R |
| 6,750,644 | B1 * | 6/2004 | Berkcan | G01R 33/02 324/117 H |
| 2004/0138836 | A1 * | 7/2004 | Ishishita | G01R 15/202 702/63 |
| 2008/0084201 | A1 * | 4/2008 | Kojori | G01R 19/0015 324/117 R |
| 2010/0036626 | A1 | 2/2010 | Kang et al. | |
| 2012/0319473 | A1 * | 12/2012 | Tzivanopoulos | G01R 15/183 307/10.1 |
| 2013/0138372 | A1 * | 5/2013 | Ausserlechner | G01R 15/207 702/65 |

(Continued)

*Primary Examiner* — Nathaniel Pelton
(74) *Attorney, Agent, or Firm* — David B. Kelley; Brooks Kushman P.C.

(57) ABSTRACT

An electric vehicle battery arrangement includes a current sensor. The current sensor has a core and a magnetic field detector. An N-turn coil is wrapped around the core. A controller is configured to adjust an output of the detector indicative of current according to a comparison between a magnetic field caused by a given current in the coil as detected by the detector and a magnetic field expected to be caused by the given current in the coil.

10 Claims, 2 Drawing Sheets

(56) References Cited

U.S. PATENT DOCUMENTS

2013/0278252 A1* 10/2013 Sasaki ................. G01R 15/183
                                                            324/253
2013/0338956 A1* 12/2013 Zieren ................ G01R 33/0035
                                                            702/104

* cited by examiner

METHOD AND SYSTEM FOR CALIBRATING CURRENT SENSOR OF ELECTRIC VEHICLE BATTERY ELECTRONICS

TECHNICAL FIELD

The present invention relates to improving accuracy of a current sensor configured to sense current flowing between an electric vehicle battery and either a load or a source.

BACKGROUND

Battery electric vehicles (BEVs) may be caused to move by operation of an electric motor. Plug-in hybrid electric vehicles (PHEVs) and hybrid electric vehicles (HEVs) may be caused to move by operation of an electric motor and/or an internal combustion engine. The motor, in either case, may receive electrical power from an on-board battery. Here, the motor is a load to the battery as current flows from the battery to the motor, for example, via an inverter. For BEVs and PHEVs, the battery may be chargeable with electrical power from a utility grid via a charger. Here, the charger is a source to the battery as current flows from the charger to the battery.

The battery electronics may include a current sensor configured to measure the current flow. Amp hour integration accuracy is a primary metric for battery recharging and it is costly to get relatively excellent accuracy. An in-vehicle calibration with a precise current allows for a relatively much less expensive current sensor.

SUMMARY

An electric vehicle battery arrangement (or system) includes a current sensor having a core and a magnetic field detector, an N-turn coil wrapped around the core, and a controller. The controller is configured to adjust an output of the detector indicative of current according to a comparison between a magnetic field caused by a given current in the coil as detected by the detector and a magnetic field expected to be caused by the given current in the coil.

The arrangement may further include a conductor extending through a central opening of the core. In this case, the output of the detector is indicative of current on the conductor.

The conductor may extend between a battery and a switch. In this case, the switch is opened while the given current is in the coil, and the switch is closed and current is absent from the coil while current is on the conductor.

The coil may be wrapped around a leg of the core.

N may be greater than one. In this case, the magnetic field expected to be caused by the current in the coil is proportional to the product of the current in the coil and N. Also, in this case, the current in the coil causes N times greater magnetic field than that caused by the current with the coil being a one-turn coil such that the magnetic field expected to be caused by the current in the coil is N times greater than the magnetic field expected to be caused by the current in the coil with the coil being a one-turn coil.

A method includes providing a current sensor having a core and a magnetic field detector and a N-turn coil wrapped around the core. The method further includes adjusting an output of the detector indicative of current according to a comparison between a magnetic field caused by a given current in the coil as detected by the detector and a magnetic field expected to be caused by the given current in the coil.

An electric vehicle includes a battery, a switch, a current sensor having a core and a magnetic field detector, a conduction line extending between the battery and the switch and extending through a central opening of the core, an N-turn coil wrapped around the core, and a controller. The controller is configured to adjust an output of the detector indicative of current on the conduction line according to a comparison between a magnetic field caused by a given current in the coil as detected by the detector and a magnetic field expected to be caused by the given current in the coil.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
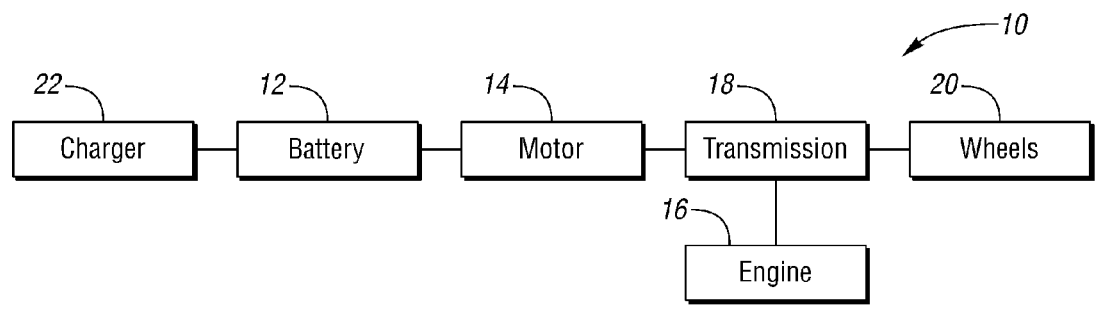
FIG. 1 illustrates a block diagram of a plug-in hybrid electric vehicle (PHEV)

Referring now to FIG. 1, a block diagram of a plug-in hybrid electric vehicle (PHEV) 10 is shown. PHEV 10 includes a high-voltage, direct current (DC) traction battery 12, an electric motor 14, an engine 16, a transmission 18, and wheels 20. Motor 14, engine 16, and wheels 20 are mechanically connected with transmission 18 such that motor 14 and/or engine 16 may drive wheels 20 and such that wheels 20 may drive motor 14. As such, battery 12 may provide energy to or receive energy from motor 14 via an inverter (not shown). Battery 14 may receive energy from a utility grid or other off-board energy source (not shown) via a (alternating current (AC)/DC)) charger 22.

Figure 2:
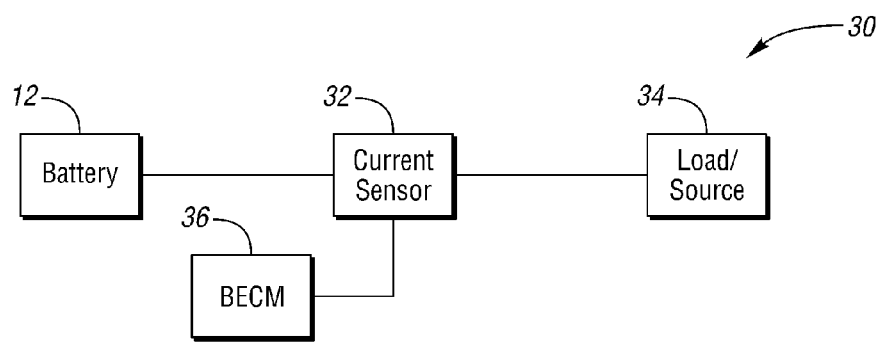
FIG. 2 illustrates a block diagram of the battery electronics of an electric vehicle such as the PHEV.

Referring now to FIG. 2, a block diagram of battery electronics 30 of an electric vehicle such as PHEV 10 is shown. Battery electronics 30 includes battery 12 and a current sensor 32. Current sensor 32 is connected between battery 12 and load/source 34 when load/source 34 is connected to battery 12. As such, current sensor 32 is configured to measure the current flowing from battery 12 to load/source 34 when load/source 34 is a load such as motor 14. Likewise, current sensor 32 is configured to measure the current flowing to battery 12 from load/source 34 when load/source 34 is a source such as charger 22.

Battery electronics 30 further includes a battery energy control module (BECM) 36. BECM 36 is configured to power current sensor 32 to enable its operation. BECM 36 is further configured to read an output generated by current sensor 32 which is indicative of the current flowing between battery 12 and load/source 34.

Figure 3:
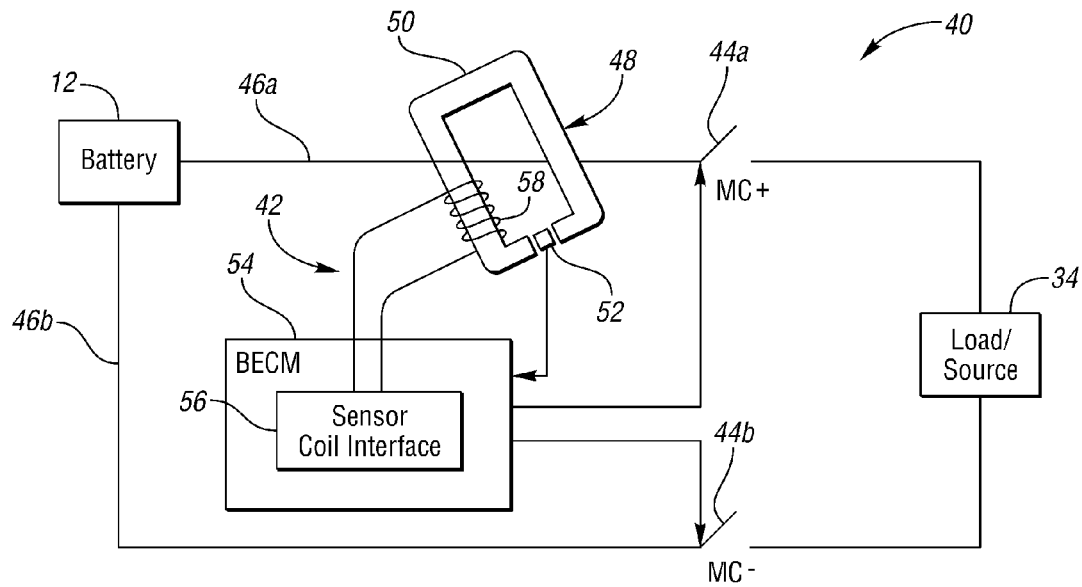
FIG. 3 illustrates a block diagram of the battery electronics including a current sensor arrangement in accordance with an embodiment of the present invention.

Referring now to FIG. 3, a block diagram of battery electronics 40 including a current sensor arrangement 42 in accordance with an embodiment of the present invention is shown. Battery electronics 40 further includes battery 12, main contactors (MC+, MC−) (e.g., switches) 44a, 44b, a conductor line 46a connected between battery 12 and MC+ contactor 44a, and a conductor line 46b connected between battery 12 and MC− contactor 44b. Battery 12 is connected to load/source 34 when MC+, MC− contactors 44a, 44b are closed. In this case, current may flow from/to battery 12 to/from load/source 34.

Current sensor arrangement 42 includes a current sensor 48. Current sensor 48 is configured to measure the current flow between battery 12 and load/source 34 when battery 12 and load/source 34 are connected.

Current sensor 48 includes a ferrite core 50 and a Hall-effect IC 52. Current sensor 48 is positioned between battery 12 and MC+ contactor 44a with conductor line 46a extending through the center opening of core 50 of current sensor 48. As such, core 50 of current sensor 48 extends around conductor line 46a. Conductor line 46a thereby passes the battery (or source) current through the center of core 50 of current sensor 48 when battery 12 is connected to load/source 34. That is, the same current flowing through battery 12, MC+, MC− contactors 44a, 44b, and load/source 34 also flows through the center of core 50 of current sensor 48. This current creates a magnetic field in core 50 of current sensor 48 which is measured by Hall IC 52 of current sensor 48. As such, in this case, the output of Hall IC 52 of current sensor 48 is indicative of the current flowing between battery 12 and load/source 34.

Current sensor arrangement 42 further includes a BECM 54. BECM 54 powers Hall IC 52 of current sensor 48 and reads the output value of Hall IC 52. The output value of Hall IC 52 represents the magnetic field applied to Hall IC 52, which is linearly proportional to the current through conductor line 46a that passes from battery 12 to MC+ contactor 44a.

Again, the aggregate of ferrite core 50 and Hall IC 52 is current sensor 48 of current sensor arrangement 42. The current of current sensor 48 is that which passes through the center of core 50 of current sensor 48, namely the current between battery 12 and load/source 34 via closed MC+, MC− contactors 44a, 44b.

A single point calibration can be performed on current sensor 48 to remove the zero offset. The zero offset is the same as the voltage output of Hall IC 52 at a time when the current through MC+ contactor 44a is zero (i.e., when MC+ contactor 44a is open). For instance, BECM 54 may measure the output voltage of Hall IC 52 of current sensor 48 when the vehicle is just starting up and MC+ contactor 44a is still open such that the current of current sensor 48 (and the MC+ current) is known to be zero. The output voltage of Hall IC 52 of current sensor 48 at this moment is referred to as the "zero offset." Ever after, an opposite sign but same magnitude correction can be applied to current sensor 48 in order to "zero" current sensor 48.

Current sensor arrangement 42 further includes a sensor coil interface 56 (e.g., a power supply). Sensor coil interface 56 may be a part of BECM 54 as shown in FIG. 3. Sensor coil interface 56 is configured to generate a relatively precise input current. In this regard, the magnitude of the input current is relatively low such that it is relatively easy for sensor coil interface 56 to generate the input current precisely. For instance, the input current is a direct current of 1.0 amps.

Current sensor arrangement 42 further includes an N-turn coil 58. N-turn coil 58 is wrapped around a leg of core 50 of current sensor 48. Sensor coil interface 56 forms a closed circuit with N-turn coil 58 and feeds the 1.0 amp input current into one of the two sides of N-turn coil 58. Both sides of N-turn coil 58 are connected to sensor coil interface 56 as shown in FIG. 3.

The amount of N turns of N-turn coil 58 generates the amount of magnetic field applied to Hall IC 52 of current sensor 48 due to the 1.0 amp input current flowing through N-turn coil 58. For instance, when N is 100 the magnetic field applied to Hall IC 52 is 100 times the magnetic field which would have been applied to Hall IC 52 with N being one. That is, when N is 100, Hall IC 52 reads 100 times the current in N-turn coil 58. Therefore, for the 1.0 amp input current in N-turn coil 58, Hall IC 52 reads a value on the order of 100 amps (although only 1.0 amps is actually flowing through N-turn coil 58).

Accordingly, with addition of sensor coil interface 56 and N-turn coil 58, a second calibration can be added to current sensor 48. In particular, at the time when the vehicle is being started and MC+ contactor 44a is open and current flow from/to battery 12 is zero, a two-step calibration can be performed. The first step, involving zero offsetting, includes BECM 54 measuring the output of Hall IC 52 while MC+ contactor 44a is open and sensor coil interface 56 is shut off (e.g., while sensor coil interface 56 is disconnected from N-turn coil 58). This is the zero-offset value for Hall IC 52 as there is zero magnetic field (no current).

The second step includes supplying a precise input current such as the 1.0 amp input current from sensor coil interface 56 to N-turn coil 58 while MC+ contactor 44a is still open. With the 1.0 amp input current flowing in N-turn coil 58, and with the current flow from/to battery 12 being zero, BECM 54 measures the output of Hall IC 52. The actual output of Hall IC 52 will be on the order of the ideal output of 100 amps (i.e., the ideal output is 1.0 amps*100 turns). The actual output of Hall IC 52 is zero-offset corrected from the first step. The correction factor to correct from the zero-offset corrected actual output to the ideal output of 100 A is called the "gain correction." BECM 54 calculates the gain correction (gain correction=absolute magnitude of (ideal output/absolute magnitude of (actual output−zero offset)). BECM 54 stores the gain correction and the zero offset. BECM 54 uses the gain correction and the zero offset in correcting subsequent outputs of Hall IC 52 generated in response to current sensor 48 measuring current flow to/from battery 12 through conductor line 46a.

As described, current sensor 48 can have a second calibration (also known as a gain calibration) which can be as accurate as accurate as the current can be measured through N-turn coil 58. For example, the input current from sensor coil interface 56 may have a tolerance of 0.1% and therefore current sensor 48 can be just as accurate. This is an excellent accuracy for a current sensor at 100 amps. By changing the amount of N turns of N-turn coil 58 or by changing the amount of input current from sensor coil interface 56 to N-turn coil 58, the equivalent of any current value can be obtained for current sensor 48. For example, it may be desirable to gain-calibrate a PHEV current sensor at its maximum current such as 250 amps.

It is noted that in the embodiment of battery electronics 40 shown in FIG. 3, current sensor 48 is positioned between battery 12 and MC+ contactor 44a as current sensor 48 is on the left hand-side of MC+ contactor 44a. In a variation, current sensor 48 is positioned between MC+ contactor 44a and load/source 34 such that current sensor 48 is on the right-hand side of MC+ contactor 44*a*. In this event, sensor coil interface 56 is configured to provide the precise input current to N-turn coil 58 when MC+ contactor 44*a* is open in the manner described above. Alternatively, load/source 34 is configured to provide (or draw) the precise input current to N-turn coil 58 when MC+ contactor 44*a* is open in order to perform the second calibration step. The conductor line from load/source 34 which passes through core 50 of current sensor 48 has zero current as load/source 34 is disconnected from this conductor line during the second calibration step. The first calibration step may be performed in similar manner as described above.

Figure 4:
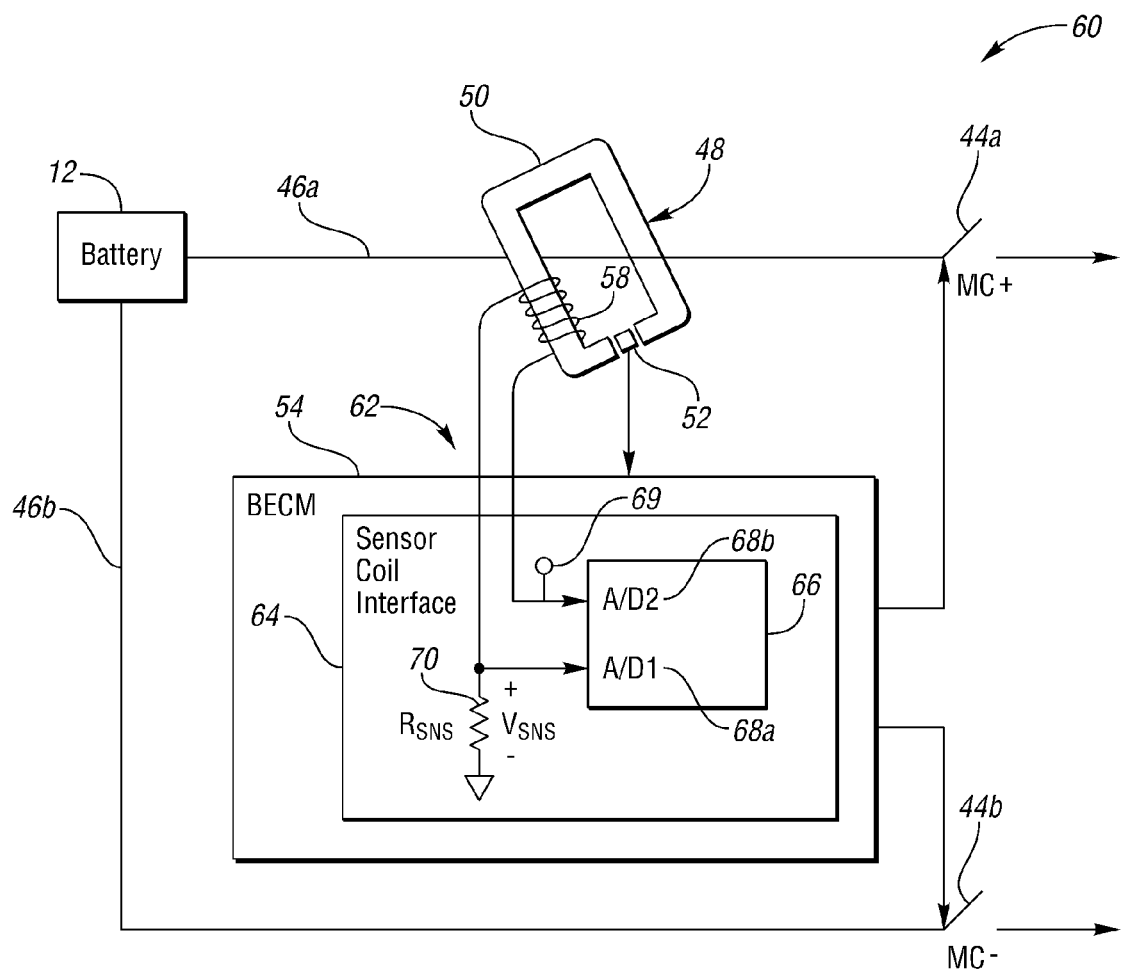
FIG. 4 illustrates a block diagram of the battery electronics including a current sensor arrangement in accordance with another embodiment of the present invention.

Referring now to FIG. 4, with continual reference to FIG. 3, a block diagram of battery electronics 60 including a current sensor arrangement 62 in accordance with another embodiment of the present invention is shown. Battery electronics 60 is similar to battery electronics 40 and like components include like reference numbers.

Current sensor arrangement 62 includes current sensor 48, BECM 54, and N-turn coil 58 like current sensor arrangement 42 of battery electronics 40. Current sensor arrangement 62 is different in that current sensor arrangement 62 includes a sensor coil interface 64 variation instead of sensor coil interface 56.

Sensor coil interface 64 may be part of BECM 54 as shown in FIG. 4. Sensor coil interface 64 includes a microprocessor 66. Processor 66 includes a first A/D1 input 68*a* and a second A/D2 input 68*b*. Sensor coil interface 64 includes a precision voltage reference supply 69 (e.g., 5.0 volts), which is measured by second A/D2 input 68*b*. This relatively precise 5.0 DC voltage is fed into one of the two sides of N-turn coil 58. The two sides of N-turn coil 58 are connected to A/D1 input 68*a* and A/D2 input 68*b*, respectively. The side of N-turn coil 58 connected to first A/D1 input 68*a* is also connected to a sense resistor 70 of sensor coil interface 64, as shown in FIG. 4. Sense resistor 70 sets the coil current in conjunction with voltage reference supply 69 and the resistance of N-turn coil 58. Sense resistor 70 is a precision resistor with, for instance, a 0.1% tolerance.

As described, BECM 54 includes processor 66 which contains first A/D1 input 68*a* and second A/D2 input 68*b*. Second A/D2 input 68*b* reads the value of voltage reference supply 69. First A/D1 input 68*a* reads voltage $V_{sns}$, which is across sense resistor 70. Since sense resistor 70 is a precise and known value of ohmic resistance, then Ohm's Law (R*I=V) can be applied to calculate the exact current flowing through N-turn coil 58. For instance, with the proper ohmic value for sense resistor 70, the coil current is 1.0 amps. The precise value of this coil current can be measured by first A/D1 input 68*a*.

Again, at the time when the vehicle is being started and MC+ contactor 44*a* is open and the battery current is zero, the two-step calibration can be performed. The first step is to measure the output of Hall IC 52 with MC+ contactor 44*a* open and voltage reference supply 69 turned off (i.e., set to zero volts). This is the zero-offset value for Hall IC 52 as there will be zero magnetic field (no current through conductor line 46*a* passing through core 50 of current sensor 48).

With MC+ contactor 52 still open, the second step commences by applying the 5.0 volts to the output of voltage reference supply 69. This causes an input current on the order of 1.0 amps to flow in N-turn coil 58. The exact supply voltage is read by second A/D2 input 68*b* and the exact coil current is measured by first A/D1 input 68*a*. With this current flowing in N-turn coil 58, BECM 54 measures the output of Hall IC 52. The actual output of Hall IC 52 will be on the order of the ideal output of 100 A (1.0 A*100 turns). The output of Hall IC 52 is zero-offset corrected from the first step. The correction factor to correct from the actual output to the ideal output of 100 A is the gain correction.

As indicated above, current sensor 48 now has a second calibration (i.e., the gain calibration) which can be as accurate as accurate as the current can be measured through N-turn coil 58, which is about 0.1% with sense resistor 70 having 0.1% tolerance. This is an excellent accuracy for a current sensor at 100 A. Again, by simply changing the amount N turns of N-turn coil 58, or by changing the amount of current by changing voltage reference supply 69, or by changing the resistance of sense resistor 70, the equivalent of any current value desired for the current sensor can be obtained.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A system comprising:
   a core around a conductor;
   a N-turns coil wrapped around the core;
   a controller to feed the coil with a calibration current, unknown within a known tolerance, of 1/N*a maximum conductor current and to adjust a magnetic field detector output indicative of conductor current according to a comparison between the detector detected and expected magnetic fields caused by the calibration current whereby the output is as accurate as the tolerance.

2. The system of claim 1 wherein:
   the conductor extends between a battery and a switch;
   the switch is opened and no conductor current is on the conductor while the calibration current is fed to the coil; and
   the switch is closed and the calibration current is absent from the coil while conductor current is on the conductor.

3. The system of claim 1 wherein:
   the coil is wrapped around a leg of the core.

4. The system of claim 1 wherein:
   the magnetic detector is a Hall-effect IC.

5. The system of claim 1 wherein:
   the controller is further configured to adjust the calibration current to other values.

6. A method comprising:
   providing a current sensor having a core around a conductor, a magnetic field detector, and a N-turn coil wrapped around the core, wherein N is greater than one;
   when no current is on the conductor, feeding the coil with a calibration current, unknown within a known tolerance, of 1/N*a maximum current to be detected on the conductor; and
   adjusting an output of the detector indicative of current on the conductor according to a comparison between a magnetic field caused by the calibration current in the coil as detected by the detector and a magnetic field expected to be caused by the calibration current in the coil whereby the output of the detector is as accurate as the known tolerance.

7. An electric vehicle comprising:
a battery;
a switch;
a current sensor having a core and a magnetic detector;
a conduction line extending between the battery and the switch and extending through a central opening of the core;
a N-turn coil wrapped around the core, wherein N is greater than one; and
a controller configured to, when no current is on the conduction line, feed the coil with a calibration current, unknown within a known tolerance, of 1/N*a maximum current to be detected on the conduction line and to adjust an output of the detector indicative of current on the conduction line according to a comparison between a magnetic field caused by the calibration current in the coil as detected by the detector and a magnetic field expected to be caused by the calibration current in the coil whereby the output of the detector is as accurate as the known tolerance.

8. The vehicle of claim 7 wherein:
the switch is opened while the calibration current is in the coil.

9. The vehicle of claim 7 wherein:
the switch is closed and calibration current is absent from the coil while current is on the conduction line.

10. The vehicle of claim 7 wherein:
the coil is wrapped around a leg of the core.

\* \* \* \* \*